(12) United States Patent
Hoenlein et al.

(10) Patent No.: US 6,466,152 B2
(45) Date of Patent: Oct. 15, 2002

(54) RESISTOR CASCADE FOR FORMING ELECTRICAL REFERENCE QUANTITIES AND ANALOG/DIGITAL CONVERTER

(75) Inventors: Wolfgang Hoenlein, Unterhaching (DE); Roland Thewes, Groebenzell (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/938,186

(22) Filed: Aug. 23, 2001

(65) Prior Publication Data
US 2002/0126031 A1 Sep. 12, 2002

(51) Int. Cl.⁷ .................................................. H03M 1/34
(52) U.S. Cl. ...................... 341/158; 341/154; 341/155; 338/205; 338/228
(58) Field of Search ................................ 341/154, 155, 341/158, 159

(56) References Cited

PUBLICATIONS

Bernholc et al., Abstract of *Mechanical and Electrical Properties of Nanotubes*; Annual Reviews Materials Research 202. 32:347–375; Internet URL http://matsci.annualreviews.org/cgi/content/abstract/32/1/347.*
Frank et al.; *Carbon Nanotube Quantum Resistors*; Science Magazine, Jun. 12, 1998; vol. 280; pp. 1744–1746.*
Paulson et al.; *Tunable Resistance of a Carbon Nanotube–Graphite Interface*; Science Magazine, vol. 290, Dec. 1, 2000, pp. 1742–1744.*
Kuttel et al.; *Growth and Applications of Nanotube Films*; 1999 Device Research Conference Digest pp. 120–123, Jun. 1999, IEEE Xplore Catalog No. 99TH8393, INSPEC Accession No. 6513126, ISBN 0–7803–5170–3.*

* cited by examiner

*Primary Examiner*—Howard L. Williams
(74) *Attorney, Agent, or Firm*—Jeffrey R. Stone

(57) ABSTRACT

A resistor cascade has a multiplicity of electrical resistors connected in series, and each electrical resistor has at least one single-walled carbon nanotube.

6 Claims, 2 Drawing Sheets

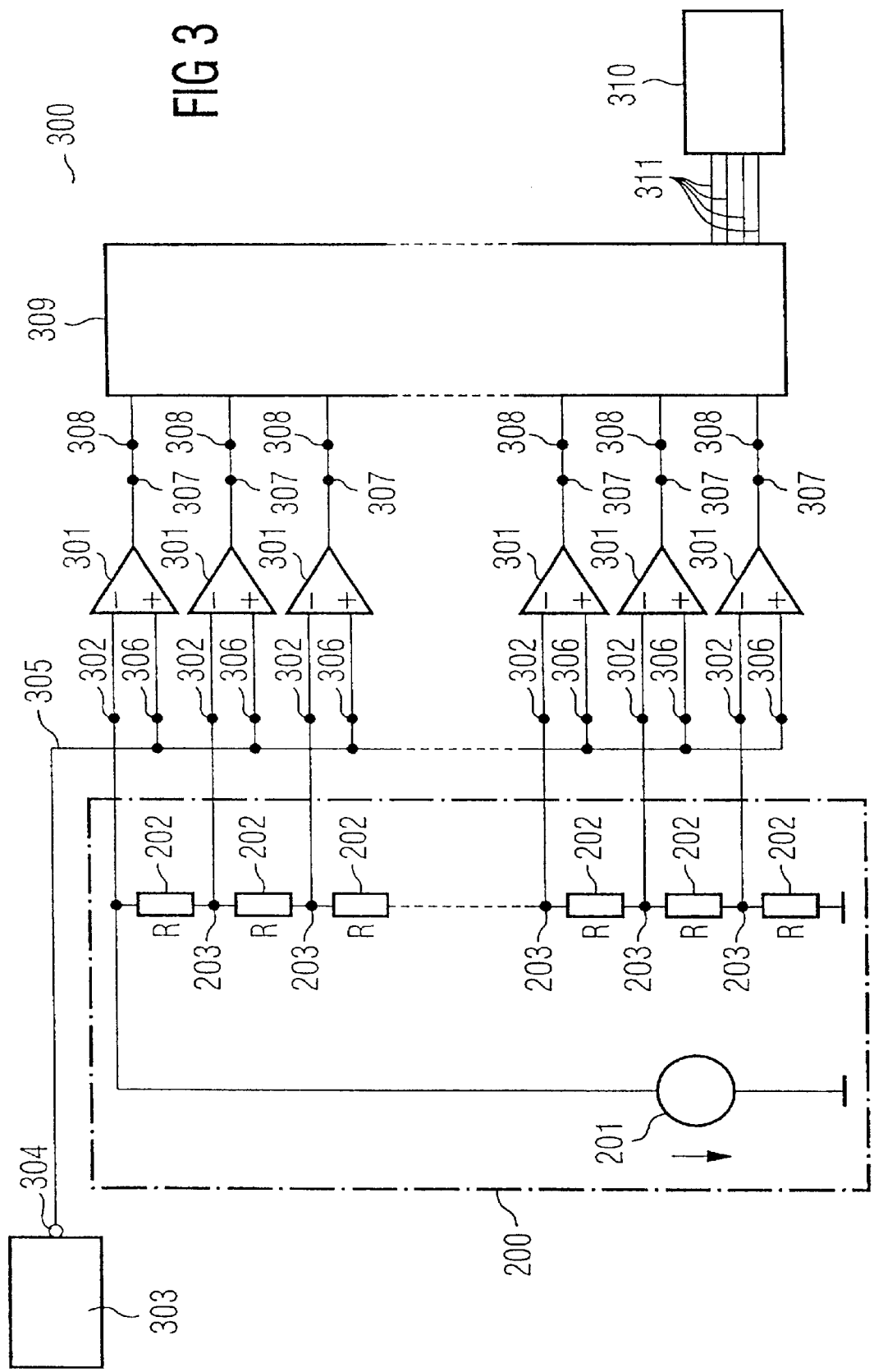

RESISTOR CASCADE FOR FORMING ELECTRICAL REFERENCE QUANTITIES AND ANALOG/DIGITAL CONVERTER

The invention relates to a resistor cascade for forming electrical reference quantities and also to an analog/digital converter.

Such a resistor cascade and such an analog/digital converter are disclosed in [1].

In various circuitry applications, in particular in analog circuits, it is necessary to provide electrical reference quantities in a form that is stepped as exactly as possible.

Thus, it is known, for example, to operate a resistor cascade having N identical electrical resistors R and a reference voltage $V_{ref}$ in such a way that, at the taps between two respective electrical resistors, the electrical voltages of the series circuit of electrical resistors are provided in accordance with the following specification:

$$V(n) = \frac{V_{ref} \cdot n}{N}, \quad \text{where } 1 \leq n \leq N \quad (1)$$

A resistor cascade of this type is used for example in a so-called flash analog/digital converter.

In this case, the analog input signal is compared, with the aid of comparators, with the different voltages in accordance with specification (1).

In this case, a logic high signal is produced at the outputs of the comparators at whose inputs the analog input signal is greater than the value $V(n)$, but a logic low signal is produced at the outputs of all the other comparators.

The output signals of the comparators are logically combined with one another in a logic circuit connected to the comparators, which circuit is designated as evaluation logic unit hereinafter, and are converted into a logic output signal in the respectively desired logic representation.

The maximum accuracy that can be achieved by such an analog/digital converter depends to a considerable extent on the accuracy and the parameter variations of the components used, in particular the resistors used in the resistor cascade.

The reference voltage $V_{ref}$ can be provided by means of so-called bandgap circuits. In the majority of cases, these circuits achieve such a high accuracy that variations in the reference voltage $V_{ref}$ are only of secondary importance with regard to the accuracy of the entire analog/digital converter.

Moreover, there are circuit variants and application variants in which this reference voltage $V_{ref}$ is provided or adjusted externally.

However, a critical quantity for the comparators is their input offset voltage.

In the case of a CMOS comparator, in particular, said voltage is essentially determined by the threshold voltage mismatch of the input transistors of the comparator.

The threshold voltage mismatch can be reduced by enlarging the area of said transistors, in accordance with the laws described in [1] and [2], this measure having only limited suitability on account of the available area for the individual electrical components in the comparator, and for other reasons as well.

A further possibility is to use so-called auto-zeroing circuits. In such an auto-zeroing circuit, the input offset of a given offset-manifesting circuit is measured at periodic time intervals and a buffer-storing of this value is applied and, during active operation of the actual offset-manifesting circuit, these buffer-stored values are subtracted again from the differential signal in order to compensate the input offset voltage.

Moreover, a further significant cause of the inaccuracy of an analog/digital converter resides in local and long-range parameter variations of the resistor cascade.

So-called local variations, which are also referred to as near field mismatch, result from statistical processes during the production of the electrical resistors of the resistor cascade and are unavoidable on account of fundamental physical basic laws.

In the case of electrical resistors made of polycrystalline silicon, the value of the electrical resistance varies for example proportionally to the reciprocal of the root of the average number of grains of the polycrystalline silicon of an electrical resistor having a given area, as described in [3].

In this case, too, enlarging the area reduces the parameter variation but inevitably leads to an increased area requirement on a chip, that is to say to a considerable spatial extent of the resulting resistor cascade.

However, since a resistor cascade cannot, in principle, be concentrated in a confined space, long-range effects such as the line width fluctuations, for example, lead to gradients in the values of the electrical resistors, as described in [4].

Thus, whereas enlarging the area leads to an improvement in the matching behavior of adjacent electronic components, long-range gradients, influenced by this measure, may perfectly well increase in the negative sense in the context of mismatch.

Furthermore, parameter variations in the electrical resistors can also be attributed

- to the inaccuracy during the doping of the individual components,
- to the inhomogeneous distribution of the electrical charge carriers, which can be attributed, in particular, to defects in the crystal lattices of the materials used, and also
- to inaccuracies in the context of the production processes, in particular during the photolithography.

Furthermore, principles of carbon nanotubes are disclosed in [5].

Furthermore, a production method for carbon nanotubes is disclosed in [6].

Moreover, it is known from [7] that the electrical resistance of a single-walled carbon nanotube is given by the so-called Klitzing resistance, which is approximately 26.5 Ω and is independent of the length and the diameter of the carbon nanotube.

[8] describes a method in which carbon nanotubes are deposited by means of self-aligned deposition between two contact areas.

[9] describes a reference voltage generator for an A/D converter or a D/A converter in which, in a voltage adjusting circuit, implemented as a resistor cascade, isolating devices are provided between individual resistors.

Furthermore, [10] discloses a further resistor chain constructed from electrical nonreactive resistors and transistors.

The invention is based on the problem of specifying a resistor cascade and also an analog/digital converter with which, in particular, the parameter variations of the electrical resistors are reduced.

The problem is solved by means of the resistor cascade and also by means of the analog/digital converter having the features in accordance with the independent patent claims.

A resistor cascade for forming electrical reference quantities from a reference voltage, which is preferably provided by a reference voltage source, has a plurality of electrical resistors which are coupled to one another in series. Each electrical resistor is formed by at least one carbon nanotube.

As described above, such a carbon nanotube has a value of its electrical resistance of 26.5 Ω, said value being essentially independent of its length and its diameter.

Consequently, disregarding the contact resistances which enable electrical coupling between the individual nanotubes, a resistor cascade is specified independently of the length and the diameter of the single-walled carbon nanotubes, which resistor cascade provides a very accurate resistor cascade which is essentially independent of the production conditions, is very robust and accurate and has very accurately identical individual electrical resistors, the carbon nanotubes.

In order to provide an electrical resistor having a value which differs from 26.5 Ω, it is possible, in order to provide this desired resistance, for an electrical resistor to be formed by a parallel circuit and/or a series circuit comprising a plurality of nanotubes, for example single-walled carbon nanotubes.

An analog/digital converter has a resistor cascade with a plurality of carbon nanotubes and also a number of comparators corresponding to the number of electrical resistors. The resistor cascade, i.e., in particular, a respective tap between two respective resistors of the resistor cascade, is in each case coupled to a first input of a comparator, with the result that, depending on the voltage source which provides the reference voltage, a predetermined fraction in accordance with specification (1) is in each case provided at the respective tap between the carbon nanotubes and is coupled to the respective first input of the comparator and is thus applied to the respective comparator.

The respective analog signal which is intended to be converted into a digital signal by the analog/digital converter can be applied to a second input of each comparator.

In this way, an analog/digital converter is specified which has a considerably improved accuracy compared with the prior art and, moreover, is insusceptible to interference and very robust with regard to different production conditions.

A further advantage of the resistor cascade according to the invention and of the analog/digital converter according to the invention is to be seen in the fact that, on account of the three-dimensional structure of the carbon nanotube, it is now possible to effect a three-dimensional interconnection and coupling between the individual electrical resistors.

One refinement of the invention provides for the outputs of the comparators to be coupled to an evaluation logic unit.

An exemplary embodiment of the invention is illustrated in the figures and is explained in more detail below.

In the figures:

FIG. 3 shows an analog/digital converter in accordance with an exemplary embodiment of the invention.

FIG. 2 shows a resistor cascade 200 with a voltage source 201, which provides a reference voltage $V_{ref}$.

Figure 1:
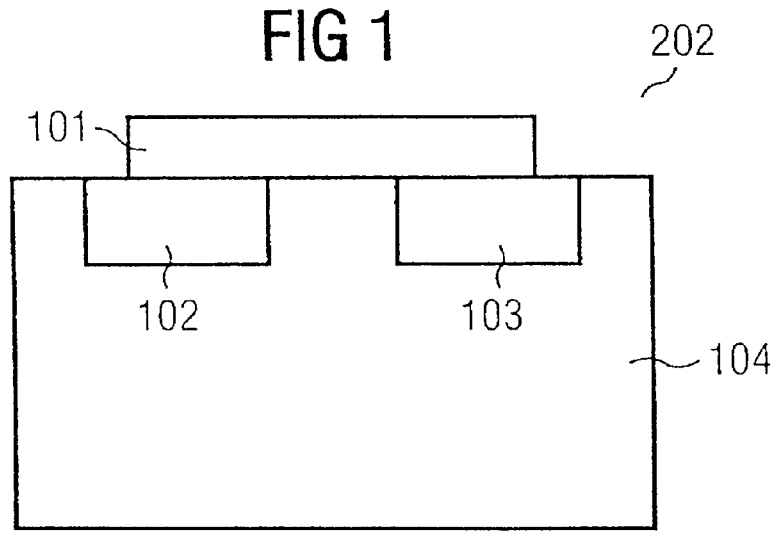
FIG. 1 shows an electrical resistor with a carbon nanotube in accordance with an exemplary embodiment of the invention.
Figure 2:
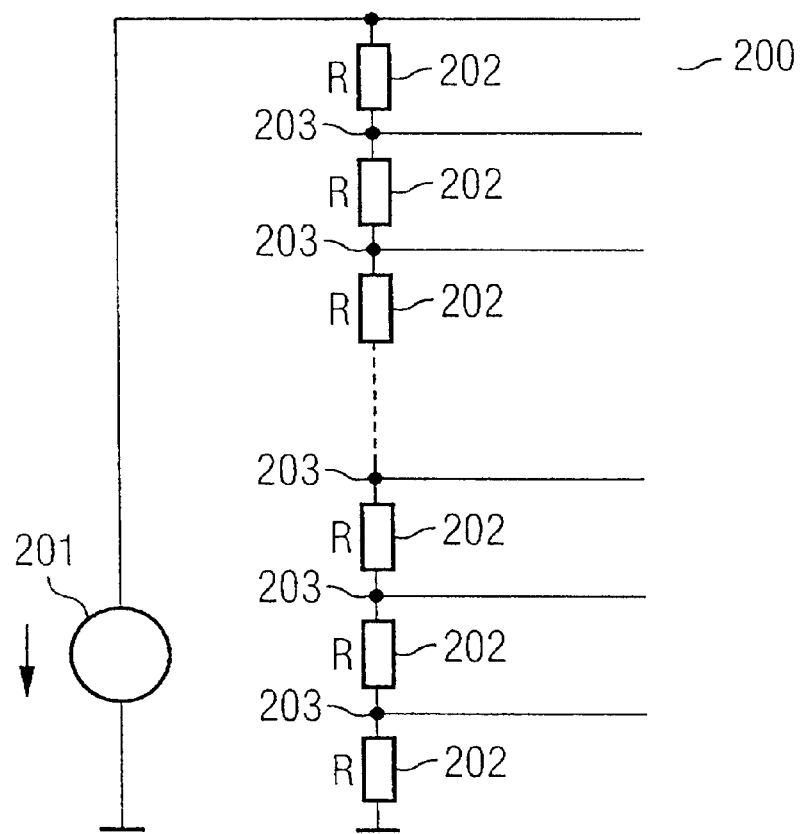
FIG. 2 shows a resistor cascade in accordance with an exemplary embodiment of the invention.

The voltage source 201 is coupled to a multiplicity of electrical resistors 202, which are coupled in series with one another.

The number of electrical resistors 202 is freely selectable, in principle.

At taps 203 between two respective electrical resistors 202, the following electrical voltages V(n) are in each case present depending on the reference voltage $V_{ref}$:

$$V(n) = \frac{V_{ref} \cdot n}{N}, \quad \text{where } 1 \leq n \leq N \quad (1)$$

In accordance with this exemplary embodiment, the resistor cascade 200 is used in an analog/digital converter 300, as illustrated in FIG. 3.

Each tap 203 of the resistor cascade 200 is connected to a corresponding comparator 301, in particular a first input 302, the inverting input in accordance with the exemplary embodiment, of the comparator 301.

To put it another way, this means that a number of comparators 301 which corresponds to the electrical resistors 202 is provided, a respective tap 203 between two electrical resistors 202 of the resistor cascade 200 being connected to the respective inverting input 302 of said comparators.

An analog input signal 203 that is to be converted into a digital output signal can be applied to an input 304 of the analog/digital converter 300.

The input 304 of the analog/digital converter 300 is connected via an input line 305 to a respective second input 306 of each comparator 301, to the non-inverting input of the respective comparator 301 in accordance with this exemplary embodiment.

Each output 307 of a comparator 301 is respectively coupled to an input 308—provided therefor—of an evaluation logic unit 309, which generates the digital output signal 310 in accordance with a predetermined mapping specification, which output signal is provided at one or more outputs 311 of the evaluation logic unit 309.

Each electrical resistor 202 of the resistor cascade 200 is formed by one or more single-walled carbon nanotubes.

If an electrical resistor 202 of the resistor cascade 200 is intended to have a value of 26.5 Ω, then one single-walled carbon nanotube is in each case used for the electrical resistor 202.

However, if the intention is to realize a different resistance for an electrical resistor 202, then a plurality or multiplicity of carbon nanotubes are connected in series or in parallel, with the result that the desired value of the respective electrical resistor 202 is produced on account of the series circuit and/or parallel circuit.

The electrical resistor 202 in accordance with the exemplary embodiment with a single-walled carbon nanotube is illustrated in FIG. 1.

The electrical resistor 202 of the resistor cascade 200 is formed by a single-walled carbon nanotube 101, which is mechanically linked and is electrically coupled to two electrically conductive contact areas 102, 103, the carbon nanotube 101 being deposited for example by means of self-aligned deposition in accordance with the method described in [8] between the two contact areas 102, 103.

The contact areas 102, 103, are embedded in an electrically insulating substrate 104.

The contact areas 102, 103 may be embodied completely or partly from catalysts for the deposition of the single-walled carbon nanotubes, as described in [6], i.e. for example from platinum, iron, cobalt or nickel, and form the electrical leads for the above-described comparators 301 of the analog/digital converter 300.

The following publications are cited in this document:

[1] M. Pelgrom et al., IEEE Journal of Solid-State-Circuits, p. 1075, 1989

[2] K. Lakshmikumar et al., IEEE Journal of Solid-State-Circuits, p. 1057, 1986

[3] R. Thewes et al., IDEM Technical Digest, pp. 771–774, 1998

[4] U. Schaper, C. Linnenbank and R. Thewes, A Novel Approach for Precise Characterization of Long Distance Mismatch of CMOS Devices, Proceedings of the ICMTS 2000

[5] P. M. Ajayan, Nanotubes from Carbon, Chemical Review, pp. 1787–1799, 1999

[6] Z. F. Ren et al., Synthesis of Large Arrays of Well-Aligned Carbon Nanotubes on Glass, Science, Vol. 282, pp. 1105–1107, November 1998
[7] S. Frank et al., Science 280, p. 1744, 1998
[8] Jing Kong et al., Synthesis of individual single-walled carbon nanotubes on patterned silicon wafers, Letters to Nature, Vol. 395, pp. 878–881, October 1998
[9] DE 31 10 800 C2
[10] DE 43 07 578 C2

What is claimed is:

1. A resistor cascade for forming electrical reference quantities, having a plurality of electrical resistors connected in series each electrical resistor having at least one carbon nanotube.

2. The resistor cascade as claimed in claim 1, in which at least some of the electrical resistors have a plurality of carbon nanotubes connected in parallel.

3. The resistor cascade as claimed in claim 1, in which at least some of the electrical resistors have a plurality of carbon nanotubes connected in series.

4. The resistor cascade as claimed in claim 1, having a voltage source which provides a reference voltage from which the reference quantities are provided in accordance with the structure of the resistor cascade.

5. An analog/digital converter having a resistor cascade as claimed in claim 1, having a number of comparators corresponding to the number of electrical resistors, a respective tap of the resistor cascade being coupled to a first input of one of the comparators in order to form a reference quantity at the first input of the respective comparator, and it being possible to apply an analog signal to a second input of each comparator.

6. The analog/digital converter as claimed in claim 5, having an evaluation logic unit whose inputs are coupled to the outputs of the comparators in order to form one or more digital output signals.

* * * * *